United States Patent

Haering et al.

[15] 3,671,820

[45] June 20, 1972

[54] HIGH VOLTAGE THIN-FILM TRANSISTOR

[72] Inventors: Rudolph R. Haering, 647 Croydon Place, North Vancouver, British Columbia, Canada; John F. O'Hanlon, RD 1, Box 41, Birdsall Dr., Yorktown Heights, N.Y. 10598

[22] Filed: April 27, 1970

[21] Appl. No.: 32,252

[52] U.S. Cl. ....................317/235 R, 317/234 S, 317/235 B, 317/235 AG, 317/235 AZ, 317/235 AP, 317/237

[51] Int. Cl. ........................H01l 5/06, H01l 3/00, H01l 3/20

[58] Field of Search ..........................................317/234, 235

[56] References Cited

UNITED STATES PATENTS

| | | | |
|---|---|---|---|
| 3,307,089 | 2/1967 | Yamashita | 317/234 |
| 3,385,731 | 5/1968 | Weimer | 117/212 |
| 3,502,950 | 3/1970 | Nigh et al. | 317/235 |

OTHER PUBLICATIONS

IBM Tech Disclosure–Greger, LV Vol. 11 No. 2 July 1968 p. 118

*Primary Examiner*—John W. Huckert
*Assistant Examiner*—William D. Larkins
*Attorney*—Fetherstonhaugh and Co.

[57] ABSTRACT

A high-voltage thin film field effect transistor has increased drain-source electrode separation and increased insulating layer thickness to avoid breakdown at high voltages. The insulating layer contains an electron-depleting film and an electron-enhancing film so that the offset voltage may be kept sufficiently low. The surface of the semiconductor layer opposite that in contact with the insulating layer is contacted by an electron-depleting layer to avoid shunt current conduction via this surface.

14 Claims, 6 Drawing Figures

INVENTORS
RUDOLPH R. HAERING
JOHN F. O'HANLON
BY
Fetherstonhaugh & Co.
ATTORNEYS

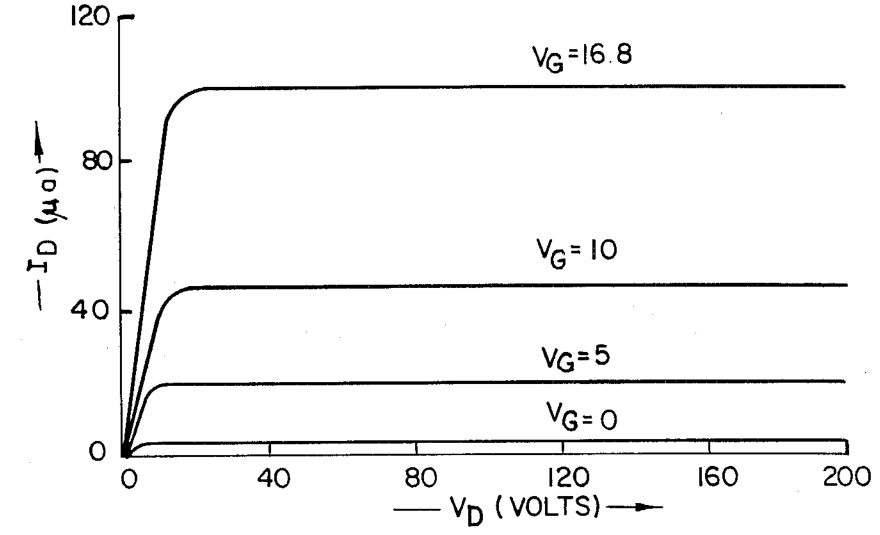
FIG. 3a. $\mu$ = 10 $CM^2$/V. SEC
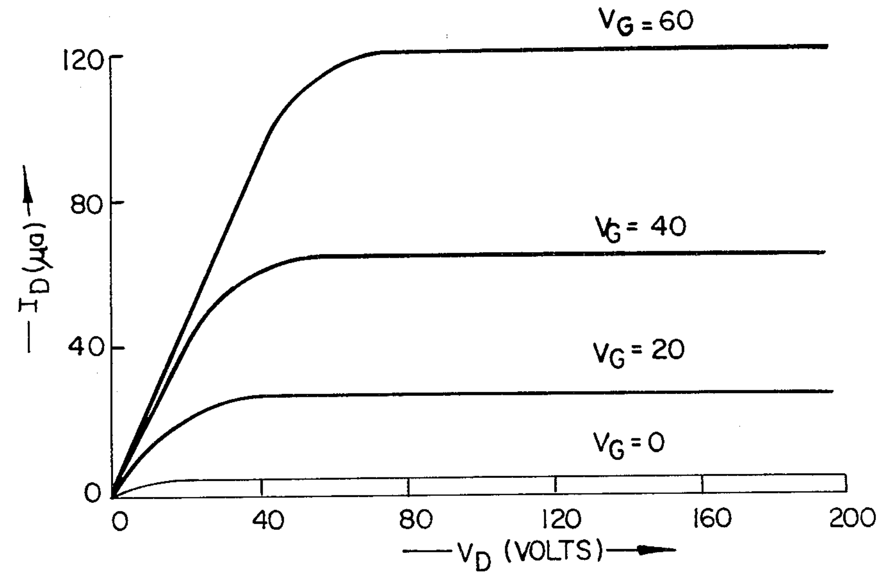
FIG. 3b. $\mu$ = 1 $cm^2$/V SEC.
INVENTORS
RUDOLPH R. HAERING
JOHN F. O'HANLON
BY
Fetherstonhaugh & Co.
ATTORNEYS

HIGH VOLTAGE THIN-FILM TRANSISTOR

BACKGROUND OF THE INVENTION

This invention relates to a high voltage thin film field effect transistor.

Conventional thin film field effect transistors can function satisfactorily with a maximum of about 20 volts between the source and drain electrodes. Typical thin film field effect transistor characteristics cannot be obtained with arbitrarily high drain or gate voltages, because in typical transistors of the type previously known, either the semiconducting layer or the gate insulation will irreversibly break down if the drain or gate voltage exceeds about 20 volts.

An obvious design modification that might be attempted with a conventional thin film transistor is simply to increase the dimensions so as to avoid the possibility of semiconductor or gate insulation breakdown. However, this simple design modification, without further refinements, fails to achieve desirable thin film transistor characteristics because of failure to deal with additional effects which are significant at the higher voltages desired to be applied.

SUMMARY OF THE INVENTION

We have found that the above-mentioned design modification comprising increasing certain critical dimensions to avoid breakdown of the semiconductor and insulating layers at high drain or gate voltages can be adopted to yield a satisfactory high voltage thin film field effect transistor, provided that two additional design features are incorporated, as follows:

1. Control of the potential of the surface of the semiconductor layer in contact with the insulating layer is regulated, by means of the application thereto of an appropriate insulating layer arrangement, thereby to regulate the offset voltage; and
2. The potential of the surface of the semiconductor layer opposite that in contact with the insulating layer is depleted of free electrons, thereby increasing the surface potential, again by means of the suitable application to the last mentioned semiconductor surface of a layer of material that effects depletion in the surface of the semiconductor layer in contact therewith.

The first of the aforesaid two features according to the invention is based on the recognition that for high voltage operation, the insulating layer must be thicker in order to avoid breakdown of the insulation. However, the thicker the insulation, the higher will be the offset voltage, unless the first design feature according to the invention is effected. We have recognized that the offset voltage can be kept reasonably low by regulating the surface potential of the semiconductor layer in contact with the insulator layer. Particularly, we have found that the insulating layer can be composed of two individual layers or films of material, one material tending to deplete the semiconductor surface of free electrons, the other tending to enhance the free electron density on the semiconductor surface. By means of a suitable choice of insulator materials of these two different types, in suitable thicknesses, the offset voltage can be kept satisfactorily low. The relative amounts of the two different types of material chosen for any particular application will depend upon the nature of the semiconductor material and upon the designer's choice of offset voltage.

The second design feature according to the present invention is based upon the recognition that in the thin film transistor, surface effects are significant, and particularly that the surface of the semiconductor layer opposite the insulating layer may, under the influence of a source-drain voltage of a few hundred volts, conduct sufficient current that the saturation characteristics of the device become unsatisfactory. If there is any appreciable surface conduction on the side of the semiconductor layer opposite the insulating layer, the device behaves as if there were a resistor connected between the source and drain electrodes in parallel with the active device. This is an undesirable non-saturating effect which is eliminated, according to this invention, by applying a layer to this surface of the semiconductor material to deplete the surface of free electrons, thereby avoiding shunt current across this surface. The specific choice of material applied will depend upon the choice of semiconductor material for the thin film transistor.

An understanding of the terms "depletion" and "enhancement" is necessary to an understanding of the present invention. Depletion and enhancement regions are regions in which, for n-type material, the electron density is lower or higher respectively than it is in the bulk of the material. In the present invention, depletion or enhancement of the surface region of the n-type semiconducting film is achieved through an appropriate choice of the adjacent insulating material. Depletion or enhancement material, as used in the specification and claims, refers to the material used in the insulating layers for establishing a depletion or enhancement effect, respectively. An insulating layer which has the effect of depleting (enhancing) the semiconductor when placed adjacent to it, is referred to as depletion (enhancement) material. The terms "depletion" and "enhancement" are therefore seen to be referable to the current carriers (electrons or holes). If reference is made to n-type semiconductor material, then a depletion region is one depleted of electrons, and an enhancement region is one having a surplus of electrons. If reference is made to p-type semiconductor material, a depletion region is one depleted of holes, and an enhancement region is one having a surplus of holes.

SUMMARY OF THE DRAWINGS

FIG. 3*a* is a graph showing representative static characteristics of a thin film transistor according to the invention for an electron mobility of 10 cm.$^2$/V.-sec.

FIG. 3*b* is a graph showing representative static characteristics of a thin film transistor according to the invention with an electron mobility of 1 cm.$^2$/V.-sec.

DETAILED DESCRIPTION WITH REFERENCE TO THE DRAWINGS

Figures 1, 2, 4A, 4B:
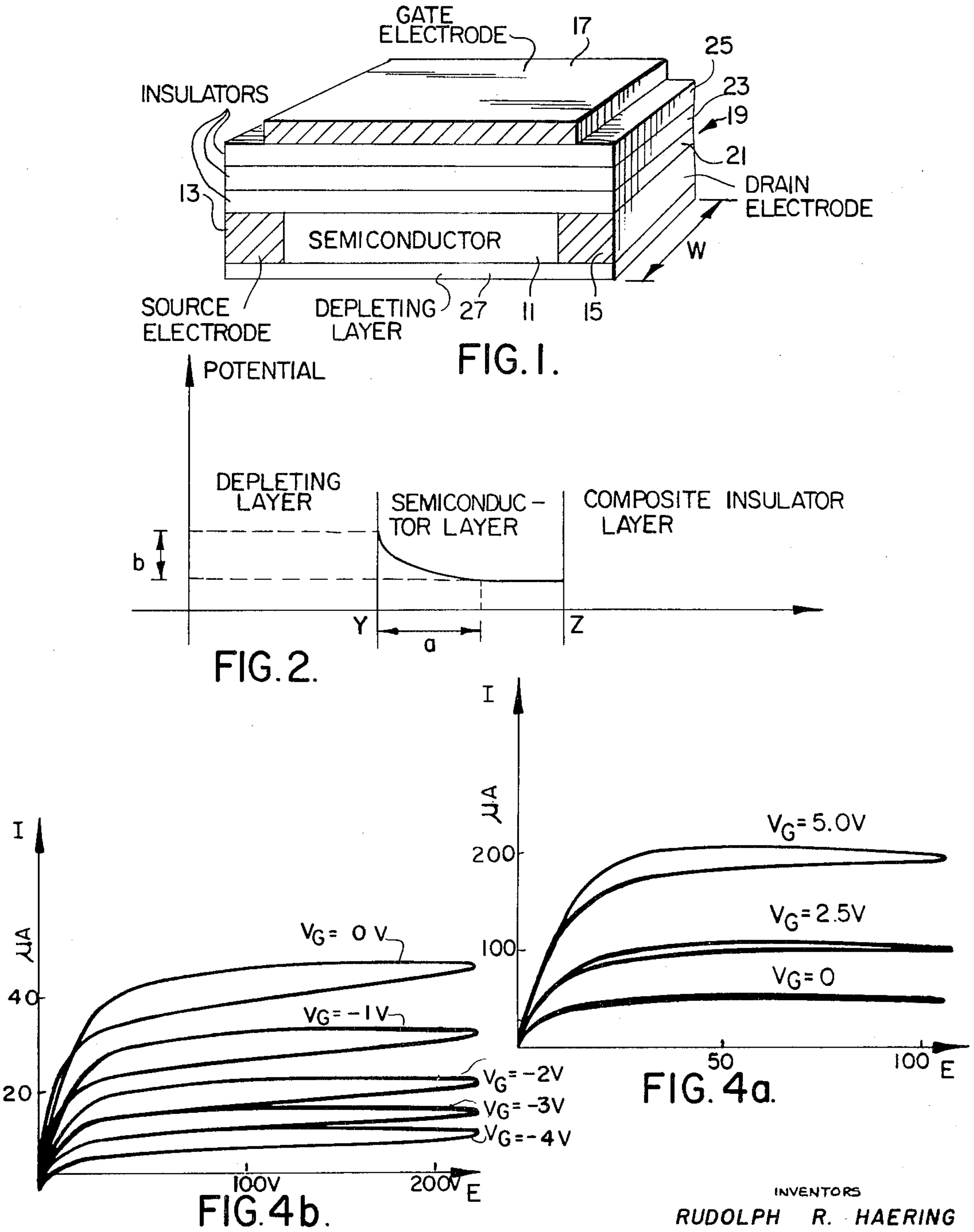
FIG. 1 is a schematic perspective view of a thin film transistor according to the invention.
FIG. 2 is a graph showing the energy band structure of a representative thin film transistor according to the present invention.
FIG. 4*a* is a graph showing the source-drain current-voltage characteristics of a particular exemplary thin film transistor constructed according to the invention, for various positive applied gate voltages.
FIG. 4*b* is a graph showing source-drain current-voltage characteristics of the transistor to which FIG. 4a applies, for various negative applied gate voltages.

Representative characteristics of a depletion-mode high voltage thin film transistor according to the invention are saturated pentode-like characteristics in which the device is turned off (source-drain current is $\approx 5\mu$A) with zero applied gate voltage, and a source-drain current of $\approx$ 100 $\mu$A flows with a gate voltage of, say, 20 V. In addition, a representative device is able to withstand source-drain voltages of 400 V. Thus, the mode of operation envisaged for the high voltage thin film transistor according to the invention implies operation in the extreme saturation region (gate voltage $\ll$ source-drain voltage).

Four basic changes in the conventional thin film transistor are required to fabricate a high voltage device with the desired characteristics:

i. The source-drain gap must be increased so that the active layer will not break down when a potential of several hundred volts is applied between the source and drain electrodes.

ii. The gate insulation thickness must be increased in order to withstand a voltage of several hundred volts, because the source-drain voltage effectively appears between the drain and gate.

iii. The saturation impedance of the device corresponding to a gate voltage $V_G = 0$ V must be increased from a typical value of 1–10 KΩ to a value high compared with the impedance of a typical load. Representative transistors according to the invention have impedances of 100 MΩ. Part of this increase in impedance is obtained as a direct result of the wider source-drain gap, if the lateral device width is kept constant.

iv. The surface state density of the semiconductor layer must be reduced so that the change under (ii) does not result in a large offset voltage $V_0$.

Changes (i) and (ii) are routine and do not require knowledge beyond the present state of the art. The present invention primarily concerns itself with the innovations required by conditions (iii) and (iv).

An estimate of the source-drain gap may be made by noting that a conventional previously known thin film transistor with a source-drain gap of $7.5 \times 10^{-4}$ cm is able to withstand a source-drain voltage of 15–20 V before breaking down. If one makes the reasonable assumption that breakdown occurs at a critical field (not at a critical voltage), a gap of $2 \times 10^{-2}$ cm. is necessary for a source-drain voltage of 400 V. Hence the modified transistor according to the present invention requires a source-drain gap which is about 25 times larger than that of previously known units, for a source-drain voltage of 400 V. In a similar manner, the gate insulation thickness may be calculated. The breakdown field strength of representative insulation materials is about $4 \times 10^6$V/cm. Thus, a gate insulation thickness of 100,000 A will withstand 400 V.

In FIG. 1, an n-type semiconductor layer 11 contacts a source electrode 13 and a drain electrode 15 at opposite ends thereof. The semiconductor layer 11 is separated from the gate electrode 17 by a composite insulating layer arrangement generally indicated as 19 and which, according to the present invention, comprises at least two different materials. In the embodiment illustrated in FIG. 1, the insulating layer arrangement 19 is shown as comprising insulator layers or films 21, 23 and 25. Applied to the lower surface of the semiconductor layer 11, i.e. the surface opposite that in contact with the insulating layer arrangement, is a depleting layer 27, composed of depletion material.

The layers 21 and 27 may be of the same material, each chosen with respect to the nature of the material of which semiconductor 11 is made such that a depletion effect at the surfaces of the semiconductor layer 11 is obtained. For the lower surface of the semiconductor layer 11, a depletion effect only is desired and therefore a single layer 27 suffices. However, at the upper surface of the semiconductor layer 11, the depletion effect induced by the layer 21 must be balanced by an enhancement effect in order to obtain satisfactory offset voltage characteristics. This is obtained by applying above the layer 21 an enhancing layer 23, composed of enhancement material. The effects under consideration are field effects, and therefore the thickness of the various layers must be chosen so that the layer 23 in fact has a field enhancement effect upon the upper surface of the semiconductor layer 11, notwithstanding that it is separated therefrom by the inter-position of the depleting layer 21. As an example, the thickness of the semiconductor layer 11 might be of the order of 1,500 A units, the layer 21 may be only about 150 A units thick, and the layer 23 may be of the order of 2,000 or more A thick. (As mentioned above, the total thickness of the composite insulating layer arrangement 19 should be about 10,000 A units at a source-drain voltage of 400 volts. The depleting layer 27 is normally about 2,000 A thick, but may be made thicker without adverse effect.) The insulator arrangement could be composed only of the narrow depleting layer 21 and the balance of the insulator 19 composed of the thicker enhancing layer 23. However, because typical enhancement layer materials are not completely satisfactory as insulators (for example, silicon monoxide tends to develop pin-hole failures which lead to insulator breakdown), it is considered preferable in many instances to have a further insulator layer 25, as illustrated in FIG. 1, which acts solely as an insulator and is sufficiently far removed from the semiconductor layer 11 that no field effect in the semiconductor layer is caused by the insulator layer 25.

The thickness of the semiconductor layer 11 is not too critical, but should be sufficiently thin that conduction through the semiconductor layer tends to be a surface phenomenon rather than a bulk phenomenon. The distance between the source electrode 13 and the drain electrode 15 depends upon the intended operating voltage; the 0.025 cm gap mentioned as being representative would suffice for an operating voltage up to 400 volts. The thickness of the depleting layer 27 is not too critical, provided that there is sufficient material in the depleting layer 27 present to deplete the lower surface of the semiconductor layer 11 of 3 electrons. The width of the entire assembly, shown as W in FIG. 1, is also arbitrary and a representative figure is 0.2 cm.

In FIG. 1, a rectangular parallelepiped geometry is shown. However, other geometrical configurations are within the skill of the art, given the principles of the present invention.

FIG. 2 illustrates the energy band structure of the semiconductor layer. The surfaces of the semiconductor layer 11 of FIG. 1 are indicated as Y and Z in the graph of FIG. 2. At the lower surface Y adjacent the depleting layer (27 in FIG. 1), it can be seen that the presence of the depleting layer has bent the energy band curve upwards to a potential above that of the semiconductor surface in contact with the insulating layer 21, as shown by potential difference *b* in FIG. 2. Dimension *a* represents the thickness of the semiconductor layer which is under the influence of the depleting layer 27. The opposite surface Z, being the one in contact with the composite insulating layer 19, has a lower potential which is determined by the relative thicknesses and materials chosen for the layers 21 and 23. The actual design choice will, as mentioned above, depend upon the specific choice of material for the semiconductor layer, the desired offset voltage, and the depletion and enhancement characteristics of the materials chosen for the composite insulating layer. The offset voltage varies directly as the free electron density at the surface Z, and inversely as the insulator thickness. Since the minimum insulator thickness is fixed by the voltage for which the transistor is designed, offset voltage is determined by the regulation of the free electron density, which in turn is regulated by the characteristics and relative thicknesses of the layers 21 and 23. The reader is referred to the inventors' paper "Control of the Surface Potential of Evaporated CdS Layers," published in the May 1967 Proceedings of the I.E.E.E., Volume 55, page 692.

Representative characteristics for the high voltage thin film transistor according to the invention are shown in FIGS. 3*a* and 3*b*. In FIG. 3*a*, the electron mobility $\mu = 10$ cm²/V.-sec., and in FIG. 3*b* $\mu = 1$ cm²/V.-sec. The electron mobility is related to the properties of the evaporated semiconductor film, and the two values of $\mu$ given are representative.

If the semiconductor layer had been selected as a p-type material, the possibility of depletion or enhancement of holes in the material, using appropriate materials adjacent the layer, will obviously occur to those skilled in the art; however, the inventors have not conducted experiments using p-type material.

EXAMPLE I

High voltage thin film transistors fabricated on glass substrates were constructed in the standard co-planar structure of FIG. 1 as well as in the inverted co-planar structure in which the gate electrode is deposited first and the semiconductor last. The following dimensions were chosen:

| | |
|---|---|
| Semiconductor layer thickness: | ≈ 1500 A |
| Source-drain electrode separation: | 0.025 cm. |
| Insulating layer (total) thickness: | 10,000 A |
| Electrode width: | 0.2 cm. |

(The insulating layer thickness refers to the thickness of all the insulating layers between the semiconductor layer and the gate electrode.)

The devices constructed utilized CdS as the active semiconductor material, aluminum source, drain and gate electrodes, and $SiO_x$, $CaF_2$, and $GeO_2$ in the composite insulation layer. These materials are however not unique and were chosen simply to demonstrate the feasibility of putting the invention into practice. The CdS was evaporated from a baffled cylindrical source held at 760° C onto a substrate heated to 115° C at a rate of 5 A/sec. Electron microscope studies indicated that only the hexagonal form was present with the C-axis normal to the surface; crystallite sizes of 300–700 A were observed. $GeO_2$ and $SiO_x$ were evaporated from platinum and boron nitride crucibles respectively at rates of 5–10 A/sec in an ambient oxygen pressure of $10^{-4}$ torr. The substrate was heated to 200° C for these depositions.

The devices constructed with $SiO_x$ insulation only were not satisfactory because the drain current at $V_G = 0$, $V_{SD} = 200$ V was $\approx$ 500 $\mu$A. Devices constructed with $CaF_2$ insulation only were also unsatisfactory because the drain current under the same conditions was < 1 $\mu$A with little gate control observable. For the applications envisaged, these insulators produced devices which were either too enhanced or too depleted.

In accordance with the principles of the invention, a thin $CaF_2$ layer was deposited between the CdS and $SiO_x$. The enhancement effect of the $SiO_x$ on the CdS surface was thereby reduced. It was found that as the thickness of the $CaF_2$ is increased, the surface becomes more depleted of free carriers. It was demonstrated for the CdS deposited in this experiment that $\approx$ 150 A of $CaF_2$ followed by an $SiO_x$ layer of at least 2,000 A resulted in an approximately flat band structure in which the surface potential of the upper surface of the semiconductor layer was nearly equal to the bulk potention of the semiconductor layer. This results in a very small (theoretically zero) offset voltage, less than about 5 volts in a representative device. For a representative device, the $CaF_2$ film was followed by 8,000 A of $SiO_x$ and 2,000 A of Geo₂, the latter being an "insulation insurance" layer to avoid pinhole breakdown of the $SiO_x$ layer. The magnitude of the "off" current can in part be controlled by varying the CdS thickness, but it is best to keep the thickness small for optimum saturation characteristics.

In addition to adjusting the upper surface potential of the CdS to the desired value, the adverse shunting effect of a leakage current along the opposite surface of the CdS was avoided, in accordance with the present invention, by depositing a film of $CaF_2$ (identified as layer 27 in FIG. 1) over this surface. This effect of $CaF_2$ on the depletion depth in evaporated CdS films was observed: 1,000 A of $CaF_2$ depleted the CdS of free carriers to a depth of 1,000 A. The shift in potential for these films with electron density $n = 4 \times 10^{16}/cm^3$ was $\approx$ 0.3 eV (corresponding to dimension *b* in FIG. 2).

Devices constructed in accordance with this example have been found to have variable characteristics, and therefore careful selection of a suitable device for a given application will be necessary, until such time as manufacturing techniques improve.

EXAMPLE II

In this example, the active material in the semiconductor layer was chosen to be CdSe. The device dimensions and geometry were the same as for Example I.

The devices were fabricated on electrically conductive glass in a conventional vacuum system at pressures between 1 and 5 $\times 10^{-6}$ torr. The source-drain gap was again 0.025 cm long and 0.2 wide. Aluminum contacts under the active layer provided satisfactory ohmic contacts. Insulators of $CaF_2$ and $SiO_x$ were used together with CdSe and these layers were deposited to give a depletion layer on the back surface with a flat-band condition on the front surface, as in Example I.

All insulator materials were deposited on room temperature substrates but the active layer was deposited on a hot substrate (250° C) to give high-resistivity material.

The insulators, high-purity SiO lumps and $CaF_2$ chips, were evaporated from a baffled tantalum source and an open tantalum boat, respectively. CdSe (high-purity sintered cake) was evaporated from a boron nitrode lined Drumheller source and the aluminum was deposited using an electron beam gun.

The source-drain current-voltage characteristics of these devices are shown in FIGS. 4a and 4b, for positive and negative gate voltages respectively ($V_G$ stands for gate voltage in the drawings). These characteristics are generally superior to those obtained for devices constructed in accordance with Example I. The apparent hysterises in FIGS. 4a and 4b is due to the fact that these data were taken at a frequency of 120 Hz. The hysterises is partly instrumental and partly the result of electron trapping in the semi-conductor.

The interesting feature of these high-voltage devices is the small gate voltage required to control the source-drain conductance. It can be seen from FIG. 4a that with a suitable load resistor, a gate voltage of 4 volts can swing the load voltage through 160 volts, representing a voltage gain of 40.

Unfortunately, the devices constructed, while having desirable current-voltage characteristics, have not been found to have long-term stability. Improved manufacturing techniques should be able to correct this problem.

What we claim as our invention is:

1. A high voltage thin film transistor of the insulated gate field effect type wherein the source-drain voltage is in excess of 200 volts, comprising:

- a semiconductor layer having first and second opposed major surfaces;
- a source electrode and a drain electrode at opposite ends of the semiconductor layer, the spacing between the source electrode and drain electrode being in excess of 0.01 cm;
- a composite insulating layer on said first major surface of the semiconductor layer and overlapping the area between the source and drain electrodes, the thickness of said layer being in excess of 8,000 A;
- a gate electrode on the surface of the composite insulating layer and overlapping the area between the source and drain electrodes and seperated from the semiconductor layer by the thickness of the insulating layer; and
- a depleting layer on the second surface of the semiconductor layer and overlapping the area between the source and drain electrodes, the thickness of said depleting layer being at least 1,000 A;
- the depleting layer effecting depletion of current carriers from the second surface of the semiconductor layer;
- the composite insulating layer comprising a film of depletion material and a film of enhancement material, said depletion material and said enhancement material of said composite layer together regulating the density of current carriers in said first surface of the semiconductor layer;
- whereby said depleting layer effects a first value of depletion of said second surface, and said composite insulating layer effects a second value of depletion of said first surface algebriacally less than said first value;
- said second value of depletion of said first surface being the algebraic sum of the depletion effected by said depletion material and of the enhancement effected by said enhancement material, with enhancement taken as a negative value of depletion;
- thereby controlling the values of the offset voltage and leakage current of said transistor.

2. A transistor as defined in claim 1, wherein the film of depletion material is in contact with the semiconductor layer and the film of enhancement material is in contact with the film of depletion material and separated from the semiconductor layer by the thickness of the film of depletion material.

3. A transistor as defined in claim 2, wherein the thickness of the composite insulating layer and the separation between the source and drain electrodes are sufficiently large to avoid breakdown of the transistor under preselected voltage conditions.

4. A transistor as defined in claim 3 wherein the characteristics and thickness of the film of depletion material and of the film of enhancement material are selected so that the bulk potential of the semiconductor layer is equal to the surface potential of the semiconductor layer at that surface of the semiconductor layer in contact with the composite insulating layer.

5. A transistor as defined in claim 3 wherein the semiconductor layer is cadmium sulfide, the said depletion materials are calcium fluoride, and the enhancement material is silicon monoxide.

6. A transistor as defined in claim 5 wherein the composite insulating layer additionally includes a film of insulating material between the silicon monoxide film and the gate electrode.

7. A transistor as defined in claim 6 wherein the additional film of insulating material is germanium oxide.

8. A transistor as defined in claim 3 wherein the semiconductor layer is cadmium selenide, the said depletion materials are calcium fluoride, and the enhancement material is silicon monoxide.

9. A transistor as defined in claim 8 wherein the composite insulating layer additionally includes a film of insulating material between the silicon monoxide film and the gate electrode.

10. A transistor as defined in claim 9 wherein the additional film of insulating material is germanium oxide.

11. A transistor as defined in claim 10 wherein the semiconductor layer is of the order of 1,500 A thick, the calcium fluoride film in the composite insulating layer is of the order of 150 A thick and the silicon monoxide film is at least 2,000 A thick.

12. A transistor as defined in claim 11 wherein the depleting layer is at least 2,000 A thick, the composite insulating layer is of the order of 10,000 A thick, and the separation between the source and drain electrodes is of the order of 0.025 cm.

13. A transistor as defined in claim 7 wherein the semiconductor layer is of the order of 1,500 A thick, the calcium fluoride film in the composite insulating layer is of the order of 150 A thick and the silicon monoxide film is at least 2,000 A thick.

14. A transistor as defined in claim 13 wherein the depleting layer is at least 2,000 A thick, the composite insulating layer is of the order of 10,000 A thick, and the separation between the source and drain electrodes is of the order of 0.025 cm.

* * * * *